(12) United States Patent
Li et al.

(10) Patent No.: US 9,648,733 B2
(45) Date of Patent: May 9, 2017

(54) METHOD OF FORMING A SUBSTRATE CORE STRUCTURE USING MICROVIA LASER DRILLING AND CONDUCTIVE LAYER PRE-PATTERNING AND SUBSTRATE CORE STRUCTURE FORMED ACCORDING TO THE METHOD

(71) Applicants: Yonggang Li, Chandler, AZ (US);
Islam Salama, Chandler, AZ (US);
Charan Gurumurthy, Higley, AZ (US); Hamid Azimi, Chandler, AZ (US)

(72) Inventors: Yonggang Li, Chandler, AZ (US);
Islam Salama, Chandler, AZ (US);
Charan Gurumurthy, Higley, AZ (US); Hamid Azimi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 164 days.

(21) Appl. No.: 13/861,338

(22) Filed: Apr. 11, 2013

(65) Prior Publication Data

US 2013/0242498 A1    Sep. 19, 2013

Related U.S. Application Data

(62) Division of application No. 11/769,900, filed on Jun. 28, 2007, now Pat. No. 8,440,916.

(51) Int. Cl.
*H05K 1/02*     (2006.01)
*H05K 3/00*     (2006.01)
(Continued)

(52) U.S. Cl.
CPC ......... *H05K 1/0298* (2013.01); *H05K 3/0032* (2013.01); *H05K 3/429* (2013.01);
(Continued)

(58) Field of Classification Search
CPC .. H01K 1/02; H01K 1/05; H01K 1/09; H01K 1/11; H01K 1/16; H01K 1/18; H05K 3/00;
(Continued)

(56) References Cited

U.S. PATENT DOCUMENTS 4,299,873 A * 11/1981 Ogihara et al. ............... 428/137
4,368,503 A *  1/1983 Kurosawa et al. ........... 361/792
(Continued)

FOREIGN PATENT DOCUMENTS

EP    1 096 842 A1    5/2001
EP    1 858 307 A1   11/2007
(Continued)

OTHER PUBLICATIONS

English Translation of Notice of Reasons for Rejection dated Dec. 7, 2011 from Japanese Patent Application No. 2010-515011 corresponding to U.S. Appl. No. 11/769,852.
(Continued)

*Primary Examiner* — Xiaoliang Chen
(74) *Attorney, Agent, or Firm* — Blakely, Sokoloff, Taylor & Zafman LLP

(57) ABSTRACT

A method of fabricating a substrate core structure comprises: providing first and second patterned conductive layers defining openings therein on each side of a starting insulating layer; providing a first and a second supplemental insulating layers onto respective ones of a first and a second patterned conductive layer; laser drilling a set of via openings extending through at least some of the conductive layer openings of the first and second patterned conductive layers; filling the set of via openings with a conductive material to provide a set of conductive vias; and providing a first and a second supplemental patterned conductive layer onto respective ones of the first and the second supplemental insulating
(Continued)

layers, the set of conductive vias contacting the first supplemental patterned conductive layer at one side thereof, and the second supplemental patterned conductive layer at another side thereof.

4 Claims, 9 Drawing Sheets

(51) Int. Cl.
H05K 3/42 (2006.01)
H05K 3/46 (2006.01)

(52) U.S. Cl.
CPC ......... *H05K 3/4652* (2013.01); *H05K 3/0035* (2013.01); *H05K 3/0038* (2013.01); *H05K 3/426* (2013.01); *H05K 3/427* (2013.01); *H05K 3/4644* (2013.01); *H05K 2201/0394* (2013.01); *H05K 2201/0959* (2013.01); *H05K 2201/0969* (2013.01); *H05K 2201/09563* (2013.01); *Y10T 29/49126* (2015.01); *Y10T 29/49155* (2015.01); *Y10T 29/49165* (2015.01)

(58) Field of Classification Search
CPC ... H05K 3/38; H05K 3/46; H05K 7/00; H01L 21/02; H01L 21/44; H01L 21/48; H01L 21/56; H01L 23/02; H01L 23/12; H01L 23/14; H01L 23/48; H01L 23/52
USPC ................ 174/250, 254–256, 258–264, 266; 361/728, 760, 762, 783, 794; 29/830, 29/852; 257/698, 704, 778
See application file for complete search history.

(56) References Cited

U.S. PATENT DOCUMENTS

| | | | |
|---|---|---|---|
| 4,556,759 A * | 12/1985 | Iadarola ........................ 174/262 |
| 5,231,751 A | 8/1993 | Sachdev et al. ................ 29/852 |
| 5,454,161 A * | 10/1995 | Beilin et al. .................... 29/852 |
| 5,543,182 A | 8/1996 | Joshi et al. |
| 5,710,071 A * | 1/1998 | Beddingfield et al. ........ 438/108 |
| 5,780,143 A | 7/1998 | Shimamoto et al. .......... 428/209 |
| 5,826,330 A | 10/1998 | Isoda et al. ..................... 29/852 |
| 5,994,771 A | 11/1999 | Sasaki et al. ................. 257/774 |
| 6,010,769 A * | 1/2000 | Sasaoka ............. H01L 21/4857 174/262 |
| 6,021,564 A * | 2/2000 | Hanson ........................... 29/852 |
| 6,030,586 A * | 2/2000 | Kuan ....................... 422/186.07 |
| 6,119,335 A | 9/2000 | Park et al. |
| 6,121,553 A * | 9/2000 | Shinada et al. ................ 174/259 |
| 6,165,820 A | 12/2000 | Pace |
| 6,165,892 A * | 12/2000 | Chazan et al. ................ 438/623 |
| 6,203,891 B1 * | 3/2001 | Noddin ......................... 428/209 |
| 6,211,485 B1 | 4/2001 | Burgess ....................... 219/121.7 |
| 6,236,302 B1 * | 5/2001 | Barrett et al. ................. 338/22 R |
| 6,237,218 B1 * | 5/2001 | Ogawa et al. .................. 29/830 |
| 6,242,282 B1 | 6/2001 | Fillion et al. |
| 6,254,971 B1 * | 7/2001 | Katayose et al. .............. 428/209 |
| 6,262,376 B1 * | 7/2001 | Hurwitz et al. ............... 174/255 |
| 6,310,391 B1 | 10/2001 | Nagasawa et al. ............. 257/700 |
| 6,320,140 B1 * | 11/2001 | Enomoto ........................ 174/264 |
| 6,329,610 B1 * | 12/2001 | Takubo ............. H01L 23/49827 174/255 |
| 6,350,365 B1 * | 2/2002 | Koyama et al. ............... 205/125 |
| 6,353,999 B1 | 3/2002 | Cheng ............................. 29/852 |
| 6,424,282 B1 | 7/2002 | Maenza |
| 6,541,755 B1 * | 4/2003 | Fujita et al. ................... 250/216 |
| 6,548,224 B1 * | 4/2003 | Chen et al. .................... 430/314 |
| 6,585,811 B2 | 7/2003 | Palmans et al. |
| 6,590,165 B1 * | 7/2003 | Takada et al. ................. 174/266 |
| 6,613,413 B1 * | 9/2003 | Japp et al. ..................... 428/131 |
| 6,631,558 B2 * | 10/2003 | Burgess ........................... 29/852 |
| 6,739,040 B1 * | 5/2004 | Nakamura et al. .............. 29/830 |
| 6,930,258 B1 * | 8/2005 | Kawasaki et al. ............. 174/264 |
| 6,930,987 B1 | 8/2005 | Fukuda et al. |
| 7,151,036 B1 * | 12/2006 | Goldberger .............. H01G 4/33 438/210 |
| 7,178,234 B2 | 2/2007 | Kawasaki et al. ............... 29/852 |
| 7,198,996 B2 | 4/2007 | Nakatani et al. ............. 438/184 |
| 7,211,289 B2 | 5/2007 | Larnerd et al. ............... 427/96.9 |
| 7,220,287 B1 * | 5/2007 | Wyrzykowska et al. ..... 29/25.03 |
| 7,230,188 B1 * | 6/2007 | En et al. ........................ 174/257 |
| 7,300,857 B2 | 11/2007 | Akram et al. ................. 438/459 |
| 7,348,677 B2 | 3/2008 | Larnerd et al. ................ 257/774 |
| 7,371,974 B2 * | 5/2008 | Toyoda et al. ................. 174/262 |
| 7,548,430 B1 * | 6/2009 | Huemoeller et al. ......... 361/760 |
| 7,633,765 B1 * | 12/2009 | Scanlan et al. ................ 361/760 |
| 7,674,987 B2 | 3/2010 | Kodama et al. .............. 174/260 |
| 7,683,458 B2 | 3/2010 | Akram et al. ................. 257/621 |
| 7,696,613 B2 | 4/2010 | Nakamura et al. |
| 8,035,214 B1 * | 10/2011 | Hirose et al. ................. 257/697 |
| 2001/0006117 A1 * | 7/2001 | Cheng ........................... 174/257 |
| 2001/0023532 A1 | 9/2001 | Fujii et al. ....................... 29/830 |
| 2001/0027875 A1 * | 10/2001 | Kim ..................... H05K 3/4623 174/255 |
| 2002/0004180 A1 * | 1/2002 | Hotta et al. ................... 430/311 |
| 2002/0031650 A1 | 3/2002 | Fischer et al. ................ 428/209 |
| 2002/0100608 A1 * | 8/2002 | Fushie et al. .................. 174/255 |
| 2002/0108776 A1 * | 8/2002 | Uchikawa et al. ............ 174/255 |
| 2002/0117743 A1 * | 8/2002 | Nakatani et al. .............. 257/687 |
| 2002/0180015 A1 | 12/2002 | Yamaguchi et al. .......... 257/678 |
| 2002/0180027 A1 * | 12/2002 | Yamaguchi et al. .......... 257/700 |
| 2003/0030125 A1 * | 2/2003 | Goldberger ......... H01L 27/0255 257/532 |
| 2003/0063453 A1 * | 4/2003 | Kusagaya et al. ............. 361/794 |
| 2003/0135994 A1 | 7/2003 | Shutou et al. |
| 2003/0136577 A1 * | 7/2003 | Abe .............................. 174/255 |
| 2003/0168254 A1 * | 9/2003 | Kariya et al. ................. 174/261 |
| 2003/0196749 A1 | 10/2003 | Japp et al. ..................... 156/250 |
| 2003/0215619 A1 | 11/2003 | Ooi et al. ...................... 428/209 |
| 2003/0222340 A1 | 12/2003 | Kondo et al. |
| 2004/0031147 A1 * | 2/2004 | Kawashima et al. ........... 29/852 |
| 2004/0080052 A1 * | 4/2004 | Ou et al. ....................... 257/774 |
| 2004/0134682 A1 * | 7/2004 | En et al. ........................ 174/258 |
| 2004/0158980 A1 | 8/2004 | Nakatani et al. ................ 29/852 |
| 2004/0212030 A1 * | 10/2004 | Asai .............................. 257/432 |
| 2004/0227227 A1 * | 11/2004 | Imanaka et al. ............... 257/700 |
| 2005/0067688 A1 * | 3/2005 | Humpston ............ B81C 1/00293 257/704 |
| 2005/0098868 A1 | 5/2005 | Chang et al. ................. 257/686 |
| 2005/0103520 A1 * | 5/2005 | Saiki ..................... H05K 3/0035 174/250 |
| 2005/0136646 A1 | 6/2005 | Larnerd et al. ............... 438/629 |
| 2005/0142033 A1 | 6/2005 | Glezer et al. |
| 2005/0146336 A1 * | 7/2005 | Kimura et al. ................ 324/538 |
| 2005/0155792 A1 * | 7/2005 | Ito et al. ........................ 174/264 |
| 2005/0185880 A1 | 8/2005 | Asai ................................ 385/14 |
| 2005/0189136 A1 * | 9/2005 | Kawasaki et al. ............. 174/255 |
| 2005/0190017 A1 | 9/2005 | Hirabayashi .................. 333/204 |
| 2005/0217893 A1 | 10/2005 | Noguchi et al. .............. 174/250 |
| 2005/0218451 A1 | 10/2005 | Jobetto |
| 2005/0218502 A1 | 10/2005 | Sunohara et al. |
| 2005/0231927 A1 * | 10/2005 | Masuyama ............. H05K 1/115 361/783 |
| 2005/0236177 A1 | 10/2005 | Inagaki et al. ................ 174/255 |
| 2006/0001166 A1 | 1/2006 | Igarashi et al. ............... 257/758 |
| 2006/0012967 A1 | 1/2006 | Asai et al. ..................... 361/764 |
| 2006/0057340 A1 | 3/2006 | Umeda et al. ................ 428/209 |
| 2006/0060956 A1 | 3/2006 | Tanikella ...................... 257/686 |
| 2006/0065534 A1 * | 3/2006 | Nakai et al. ................... 205/118 |
| 2006/0083895 A1 * | 4/2006 | Ikeda ........................... B32B 3/10 428/137 |
| 2006/0125072 A1 | 6/2006 | Mihara |
| 2006/0158865 A1 | 7/2006 | Ohmi et al. |
| 2006/0183316 A1 | 8/2006 | Larnerd et al. ............... 438/622 |
| 2006/0185141 A1 | 8/2006 | Mori et al. |
| 2006/0191710 A1 | 8/2006 | Fushie et al. .................. 174/258 |
| 2006/0220167 A1 | 10/2006 | Min et al. ..................... 257/499 |
| 2006/0226457 A1 | 10/2006 | Abe |
| 2006/0226537 A1 * | 10/2006 | Okabe et al. ................. 257/700 |
| 2006/0243478 A1 * | 11/2006 | Inagaki et al. ............... 174/255 |
| 2006/0244134 A1 * | 11/2006 | Inagaki et al. ............... 257/734 |

(56) References Cited

U.S. PATENT DOCUMENTS

| | | | |
|---|---|---|---|
| 2006/0263003 A1 | 11/2006 | Asai et al. | 385/14 |
| 2006/0272853 A1* | 12/2006 | Muramatsu et al. | 174/262 |
| 2006/0289202 A1* | 12/2006 | Takeuchi | H01L 23/49827 174/262 |
| 2007/0010065 A1* | 1/2007 | Das et al. | 438/393 |
| 2007/0023202 A1 | 2/2007 | Shibata et al. | |
| 2007/0029106 A1* | 2/2007 | Kato | 174/255 |
| 2007/0044999 A1 | 3/2007 | Shibata et al. | 174/262 |
| 2007/0057375 A1* | 3/2007 | Nakamura | H01L 21/4857 257/758 |
| 2007/0074895 A1 | 4/2007 | Noguchi et al. | 174/250 |
| 2007/0096289 A1 | 5/2007 | Enomoto et al. | 257/687 |
| 2007/0096328 A1 | 5/2007 | Takahashi et al. | |
| 2007/0132087 A1 | 6/2007 | Kim et al. | 257/698 |
| 2007/0132088 A1* | 6/2007 | Kariya et al. | 257/698 |
| 2007/0181994 A1 | 8/2007 | Fukase et al. | 257/700 |
| 2007/0222030 A1* | 9/2007 | Salama et al. | 257/532 |
| 2007/0223935 A1* | 9/2007 | Asai et al. | 398/164 |
| 2007/0242440 A1* | 10/2007 | Sugaya et al. | 361/762 |
| 2007/0263364 A1* | 11/2007 | Kawabe et al. | 361/728 |
| 2007/0273047 A1* | 11/2007 | Nakai et al. | 257/784 |
| 2007/0281471 A1* | 12/2007 | Hurwitz et al. | 438/638 |
| 2008/0052904 A1 | 3/2008 | Schneider et al. | |
| 2008/0121417 A1* | 5/2008 | Fan | 174/260 |
| 2008/0164057 A1* | 7/2008 | Mori | H05K 3/421 174/262 |
| 2008/0236876 A1 | 10/2008 | Kodama et al. | 174/260 |
| 2008/0247703 A1 | 10/2008 | Kodama et al. | 385/14 |
| 2008/0247704 A1 | 10/2008 | Kodama et al. | 385/14 |
| 2008/0264681 A1* | 10/2008 | Iwai et al. | 174/257 |
| 2008/0285910 A1 | 11/2008 | Yamada et al. | 385/14 |
| 2008/0289866 A1 | 11/2008 | Yuri et al. | 174/260 |
| 2009/0001550 A1 | 1/2009 | Li et al. | 257/700 |
| 2009/0016671 A1 | 1/2009 | Asai et al. | 385/14 |

FOREIGN PATENT DOCUMENTS

| | | |
|---|---|---|
| EP | 1 936 682 A1 | 6/2008 |
| JP | 64-032657 | 2/1989 |
| JP | 11-266084 | 9/1999 |
| JP | 2001-156460 | 6/2001 |
| JP | 2001-196743 | 7/2001 |
| JP | 2003-69226 | 8/2001 |
| JP | 2005-005417 | 6/2003 |
| JP | 2005-116868 | 10/2003 |
| JP | 2004-259795 | 9/2004 |
| JP | 2005-72063 | 3/2005 |
| JP | 2005-123397 | 3/2005 |
| JP | 2006-114741 | 4/2006 |
| KR | 10-2007-0034766 | 3/2007 |
| WO | WO 02/074029 A1 | 9/2002 |
| WO | WO 2006/010639 A2 | 2/2006 |
| WO | WO 2007/007857 A1 | 1/2007 |
| WO | WO 2007/043683 A1 | 4/2007 |
| WO | WO 2009/006065 | 1/2009 |

OTHER PUBLICATIONS

Office Action mailed Nov. 23, 2012, U.S. Appl. No. 11/769,852, filed Jun. 28, 2007.

English Translation of Office Action from Taiwan Patent Application No. 097123929, dated May 25, 2012 corresponding to U.S. Appl. No. 11/769,900.

Office Action and Summary of Notice of Reasons from Japanese Patent Application No. 2010-515054 dated Oct. 5, 2012 corresponding to U.S. Appl. No. 11/769,900.

English Translation of Office Action from Taiwan Patent Application No. 097123727 dated May 25, 2012 corresponding to U.S. Appl. No. 11/769,852.

Decision of Rejection dated Dec. 4, 2012 from Chinese Patent Application No. 200880022291.7, corresponding to U.S. Appl. No. 11/769,852.

English Translation of Decision of Rejection and Decision to Dismiss Amendment dated Dec. 18, 2012 from Japanese Patent Application No. 2010-515011 corresponding to U.S. Appl. No. 11/769,852.

PCT/US2008/067847 Written Opinion dated Sep. 26, 2008 corresponding to U.S. Appl. No. 11/769,852.

Chinese Patent Application No. 200880022013.1 Notice of First Office Action dated Dec. 31, 2010 corresponding to U.S. Appl. No. 11/769,900.

English Translation of Korean Patent Application No. 10-2009-7026882 Notice of Preliminary Rejection dated Jun. 8, 2011 corresponding to U.S. Appl. No. 11/769,900.

Taiwan Patent Application No. 097123929 Office Action Primary Examination dated Jul. 4, 2011 corresponding to U.S. Appl. No. 11/769,900.

Office Action mailed May 27, 2009, U.S. Appl. No. 11/769,852, filed Jun. 28, 2007.

Office Action mailed Jan. 6, 2010, U.S. Appl. No. 11/769,852, filed Jun. 28, 2007.

Office Action mailed Nov. 23, 2010, U.S. Appl. No. 11/769,852, filed Jun. 28, 2007.

Office Action mailed Apr. 28, 2011, U.S. Appl. No. 11/769,852, filed Jun. 28, 2007.

English Translation of Korean Patent Application No. 2009-7027069, Notice of Preliminary Rejection dated Jun. 8, 2011 (English Translation) corresponding to U.S. Appl. No. 11/769,852.

Chinese Patent Application No. 200880022291.7, Notice of First Office Action dated May 4, 2011 corresponding to U.S. Appl. No. 11/769,852.

Taiwan Patent Application No. 097123727, Office Action in Primary Examination dated Jul. 24, 2011 corresponding to U.S. Appl. No. 11/769,852.

English Translation of Final Notice of Reasons for Rejection dated Jan. 29, 2013 from Japanese Patent Application No. 2010-515054 corresponding to U.S. Appl. No. 11/769,900.

Notice of Reason for Rejection dated May 20, 2014, Japanese Patent Application No. 2013-168698 corresponding to U.S. Appl. No. 11/769,900.

Decision of Refusal dated Dec. 16, 2014, Japanese Patent Application No. 2013-168698, 2 pages and English translation thereof.

English Translation of Notice of Reasons for Rejection dated Feb. 21, 2012 from Japanese Patent Application No. 2010-515054.

Decision of Rejection received from the Board of Appeals from the Japan Patent Office dated Jan. 12, 2016, Japanese Patent Application No. 2013-168698 and English Translation thereof.

\* cited by examiner

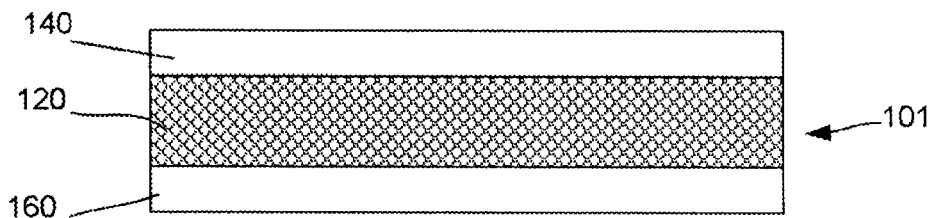
Fig. 1 – Prior Art
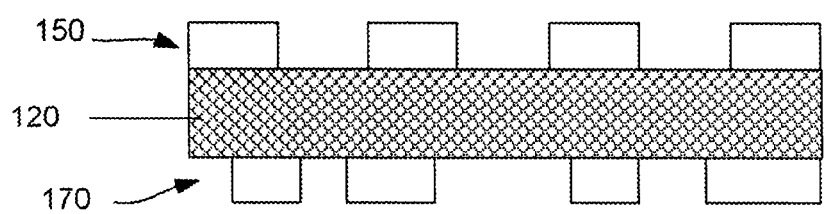
Fig. 2 – Prior Art
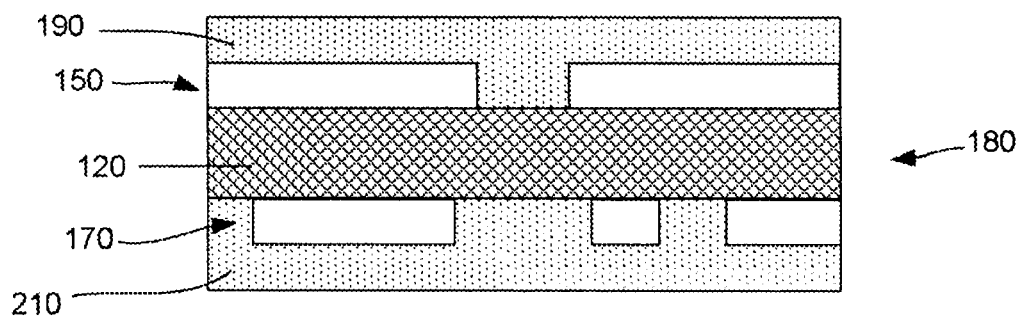
Fig. 3 – Prior Art
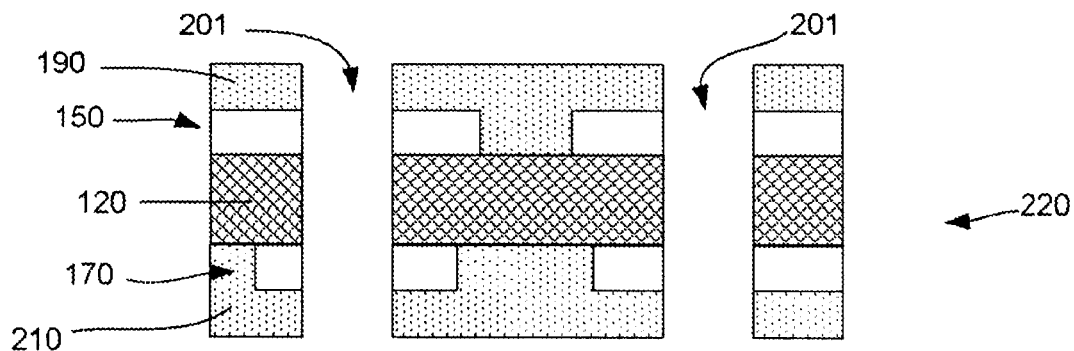
Fig. 4 – Prior Art

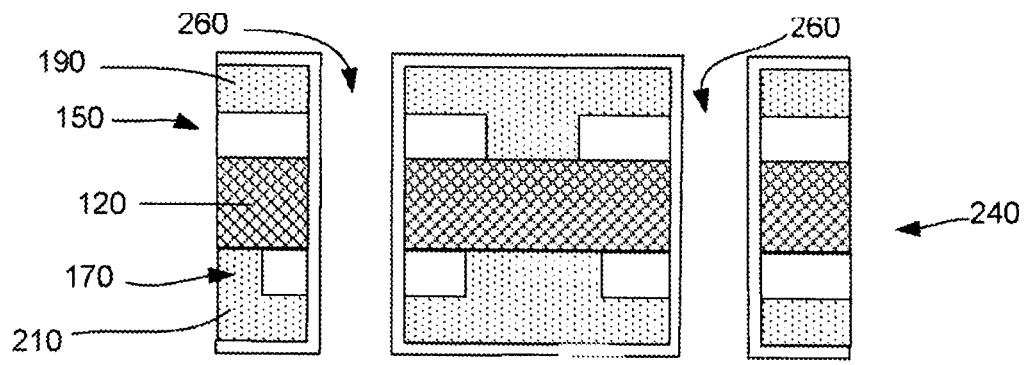
Fig. 5 – Prior Art
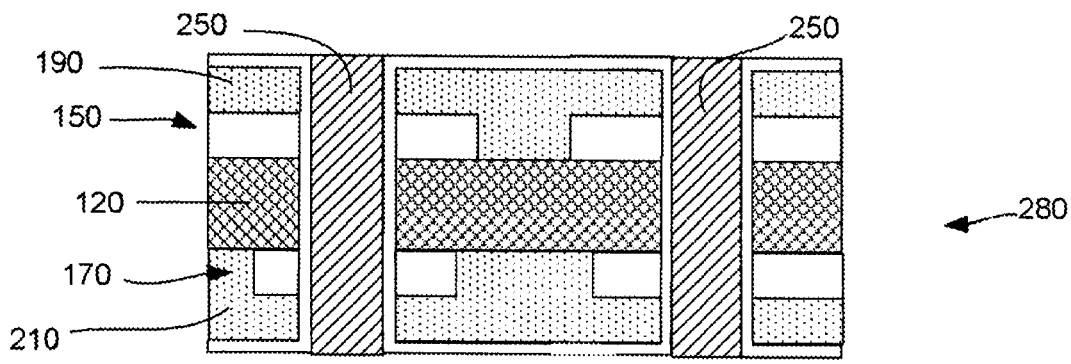
Fig. 6 – Prior Art
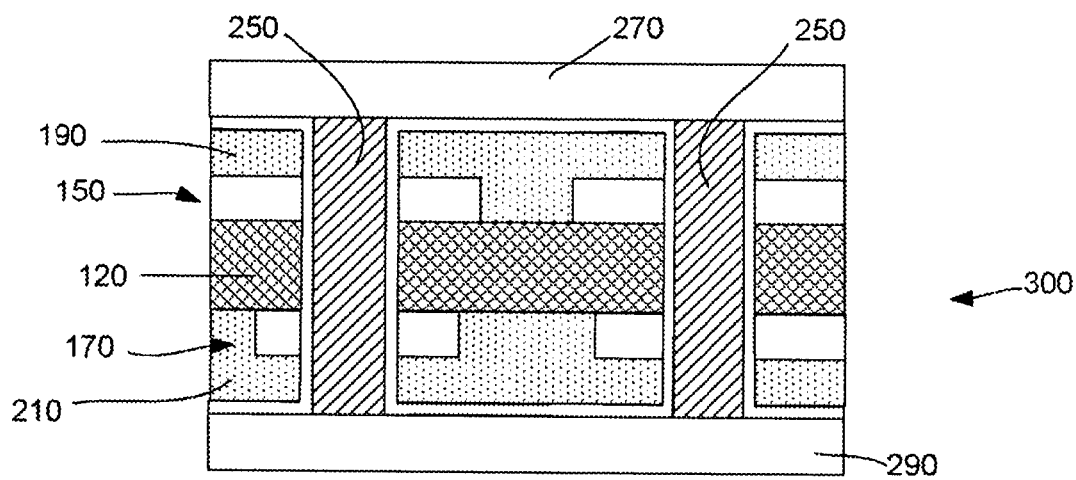
Fig. 7 – Prior Art

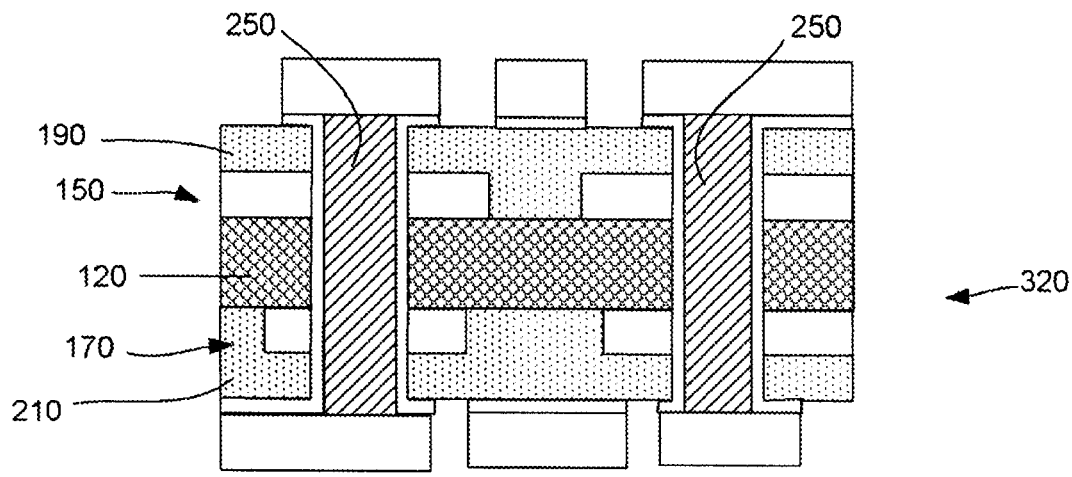
Fig. 8 – Prior Art
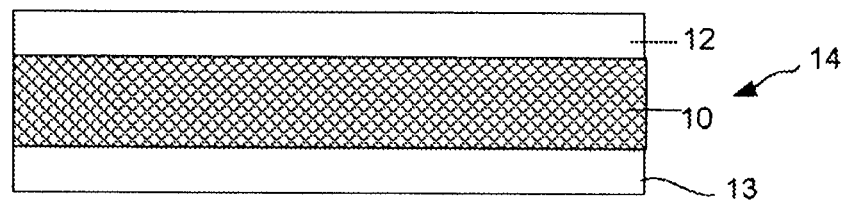
Fig. 9a
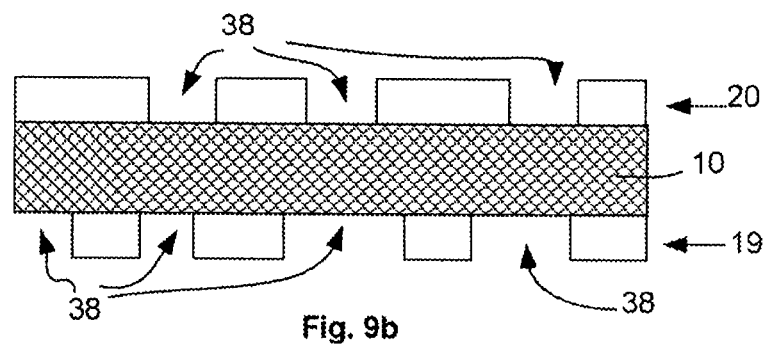
Fig. 9b

METHOD OF FORMING A SUBSTRATE CORE STRUCTURE USING MICROVIA LASER DRILLING AND CONDUCTIVE LAYER PRE-PATTERNING AND SUBSTRATE CORE STRUCTURE FORMED ACCORDING TO THE METHOD

This is a Divisional Application of Ser. No. 11/769,900 filed Jun. 28, 2007, which is presently pending.

FIELD

Embodiments of the present invention relate generally to the field of multilayer substrate core structure fabrication, and, in particular, to methods for fabricating such a board by laser drilling microvias therein.

BACKGROUND

A multilayer substrate core structure may be conventionally fabricated by first providing a copper clad core. The copper clad core (CCL) may be a laminate that is copper clad on one or two sides depending on application needs. An example of such a fabrication process is shown in FIGS. 1-8. As seen in FIG. 1, a two sided CCL 101 is first provided including an insulating laminate 12 and top and bottom copper films 140 and 160, respectively. As seen in FIG. 2, the top and bottom copper films 140 and 160 are pre-patterned according to pre-determined interconnect patterns to be provided onto the laminate 120, such as by way of etching, to provide patterned copper films 150 and 170. Thereafter, as seen in FIG. 3, dielectric layer, such as ABF layers 190 and 210 (Ajinomoto Build-Up Film), are laminated onto the patterned copper films 150 and 160, and, as seen in FIG. 4 to provide a first intermediate laminate 180. As seen in FIG. 4, the first intermediate laminate 180 is then provided with through holes 201 by way of mechanical drilling and des-mearing to provide a second intermediate laminate 220. The de-smearing involves using a desmear solution to process the board to dissolve and remove any smears caused by drilling. As seen in FIG. 5, the through-holes 201 and the top and bottom surfaces of the intermediate laminate 220 are then plated, such as by way of plating, to provide a plated intermediate laminate 240 with plated through holes 260. As seen in FIG. 6, the plated intermediate laminate 240 may be subjected thereafter to PTH plugging with a conductive material 250 such as copper to yield a plugged intermediate laminate 280. In a next stage, as shown in FIG. 7, the plugged intermediate laminate 280 may be lid plated with a conductive material such as copper to provide lids 270 and 290 on a top and bottom surface thereof, the plating occurring on the top and bottom plating existing on laminate 280 of FIG. 6 to yield a lid plated intermediate laminate 300. Thereafter, the copper existing at the top and bottom surfaces of lid plated intermediate laminate 30 is patterned, such as by way of etching, to yield the wiring board 320 as shown in FIG. 8.

Prior art substrates are typically built on the base of a thick core (for example one having a thickness of about 0.7 mm (not including any build-up or conductive layers). The prior art core build up process can be lengthy. Taking a four layer core as an example, the macro process stages of a prior art fabrication process may include all of: core baking and cleaning, core copper patterning, copper roughening, ABF lamination, plated through hole drilling, desmear, copper plating, copper roughening, plated through hole plugging, surface flattening, copper plating, and finally, copper patterning. However, mechanical plated through hole drilling can be the most expensive single process in the fabrication of a prior art multilayer substrate core structure. The need for plugging as explained above can add more to the manufacturing costs according to the prior art.

Disadvantageously, substrate core structures for substrate core structures according to the prior art can be costly, and can carry high manufacturing costs as a result of the use of mechanical drilling technology. These costs can skyrocket where the substrate core structures are miniaturized and scaled for future applications. In addition, mechanical drilling is not suitable for producing holes smaller than about 150 microns.

The prior art fails to provide a cost-effective, expedient and reliable method of providing a multilayer substrate core structure.

BRIEF DESCRIPTION OF THE DRAWINGS

FIGS. 1-8 show stages of forming a substrate core structure according to the prior art;

FIGS. 9a-9f show stages of forming a multilayer substrate core structure according to a first embodiment;

Figure 9C:
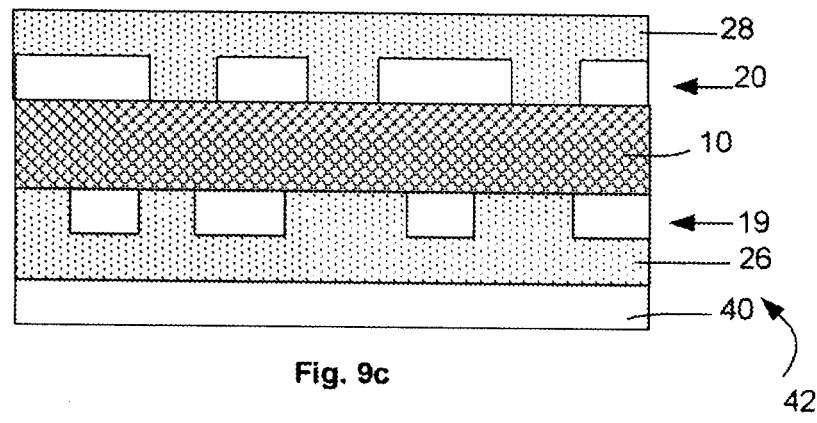

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method of fabricating a substrate core structure, such as a substrate core structure, a substrate core structure formed according to the method, and a system including the substrate core structure, are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, onto above, below, and adjacent as used herein refer to the position of one element relative to other elements. As such, a first element disposed on, onto, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to FIGS. X/Y showing an element A/B, what is meant is that Fig. X shows element A and Fig. Y shows element B. In addition, a "layer" as used herein may refer to a layer made of a single material, a layer made of a mixture of different components, a layer made of various sub-layers, each sub-layer also having the same definition of layer as set forth above.

Aspects of this and other embodiments will be discussed herein with respect to FIGS. 9a-12 below. FIGS. 9a-9f show stages for the fabrication of a multilayer substrate core structure according to a first method embodiment involving the lamination of a single sided copper clad core onto a patterned starting insulating layer followed by laser through-via drilling and subtractive patterning. FIGS. 10a-10f show stages for the fabrication of a multilayer substrate core structure according to a second method embodiment involving the lamination of two single sided copper clad cores onto a patterned starting insulating layer followed by laser through via drilling and subtractive patterning. FIGS. 11a-11g show stages for the fabrication of a multilayer substrate core structure according to a third embodiment involving the use of via plugging and semi-additive patterning. FIG. 12 shows a system incorporating a multilayer substrate core structure according to an embodiment. The figures, however, should not be taken to be limiting, as are intended for the purpose of explanation and understanding.

Figure 10A:
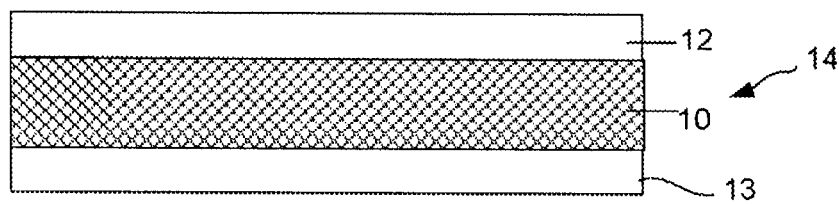
FIGS. 10a-10f show stages of forming a multilayer substrate core structure according to a second embodiment.
Figure 11A:
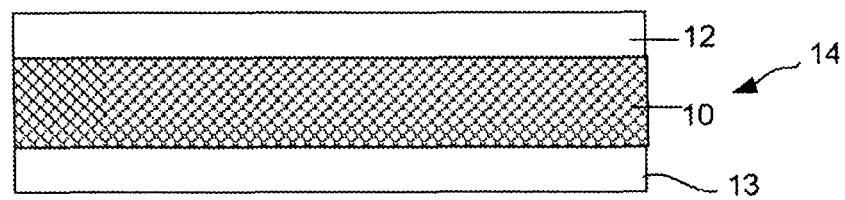
FIGS. 11a-11g show stages of forming a multilayer substrate core structure according to a third embodiment.
Figure 12:
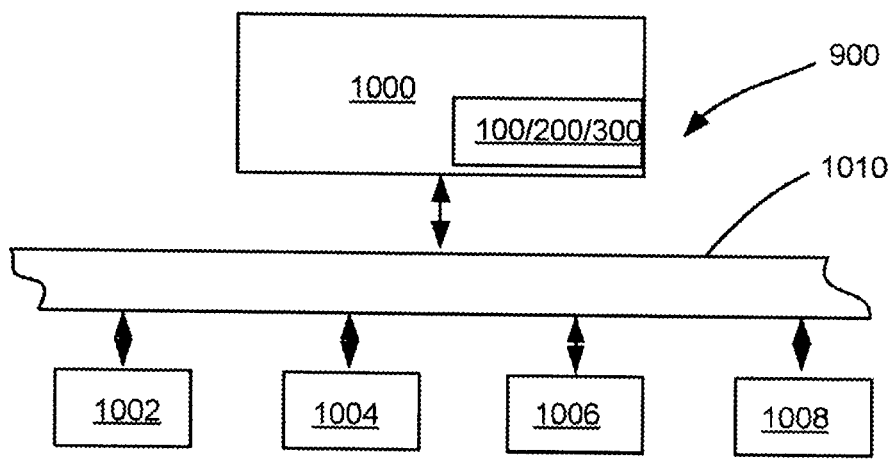
FIG. 12 is a schematic view of an embodiment of a system incorporating a multilayer substrate core structure as shown in either of FIG. 9f, 10f or 11g.

Referring to FIGS. 9a, 10a and 11a, method embodiments include providing a starting insulating layer 10. The starting insulating layer may include any one of well known core insulating/dielectric materials, such as, for example, glass epoxy resin or bismaleimide-triazine (BT), or ABF. Preferably, the starting insulating layer comprises a fiber reinforced glass epoxy resin. According to one embodiment, as shown in FIGS. 9a, 10a, and 11a, the starting insulating layer 10 may include initial conductive layers 12 and 13 thereon, such as conductive layers made of copper. In the shown embodiments of FIGS. 9a, 10a, and 11a, the starting insulating layer 10 may be part of a conventional copper clad core or CCL 14.

Figure 10B:
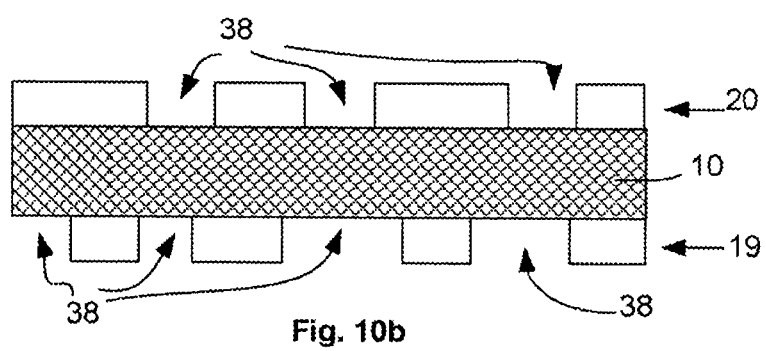
Figure 11B:
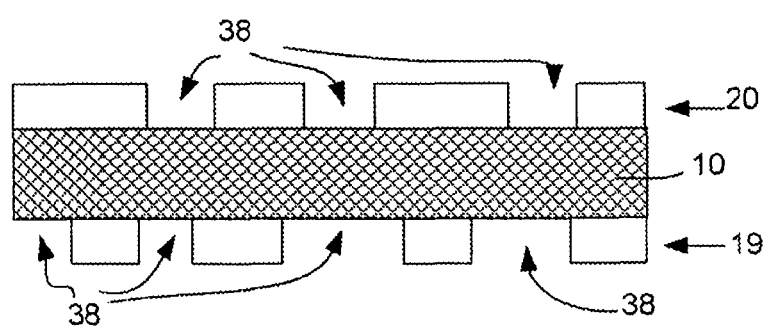

Referring next to FIGS. 9b, 10b and 11b, method embodiments include providing a first patterned conductive layer 19 on one side of the starting insulating layer 10, and a second patterned conductive layer 20 on another side of the starting insulating layer 10. For all three embodiments shown, providing the first/second patterned conductive layer may include patterning the initial conductive layer 12/13 by way of etching. Embodiments, however, are not limited to the provision of first/second patterned conductive layers by way of subtractive patterning, and include within their scope the provision of patterned conductive layers in any one of well known manners, such as, for example, by way of semi-additive patterning. According to embodiments, each of the first patterned conductive layer 19 and the second patterned conductive layer 20 define conductive layer openings 38 therein as a result of the patterning process.

Figure 10C:
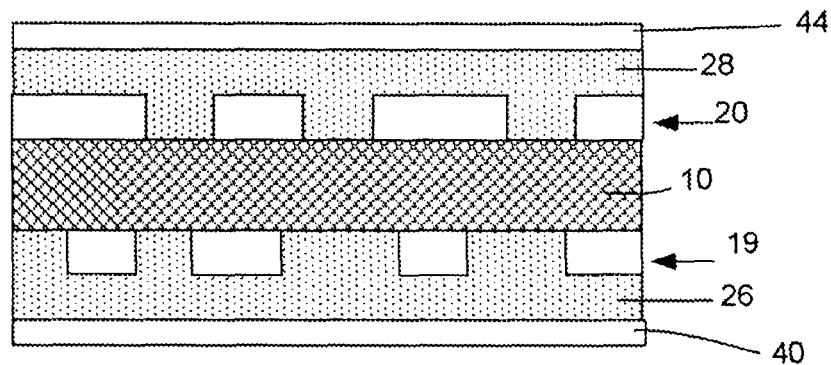
Figure 11C:
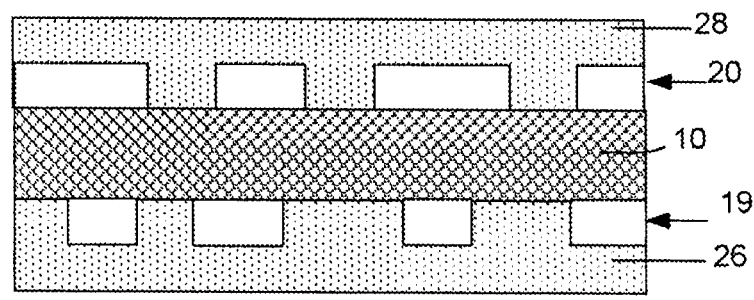

Referring next to FIGS. 9c, 10c and 11c, method embodiments include providing a first supplemental insulating layer 26 onto the first patterned conductive layer 19, and a second supplemental insulating layer 28 onto the second patterned conductive layer 20 as shown. A supplemental insulating layer according to embodiments may include the same material as the one used for the starting insulating layer as noted above. According to an embodiment, provision of a supplemental insulating layer may include laminating the supplemental insulating layer onto a corresponding patterned conductive layer. In the embodiment of FIG. 9c, the first supplemental insulating layer 26 may be laminated onto the first patterned conductive layer 19 along with a first supplemental conductive layer 40 disposed on one side of the first supplemental insulating layer 26. For example, according to the first embodiment, a combination of the first supplemental insulating layer 26 and the first supplemental conductive layer 40 may comprise a single sided copper clad core 42. The single sided copper clad core 42 is shown in the embodiment of FIG. 9c as being provided onto the first patterned conductive layer 19 such that the supplemental insulating layer 26 is disposed between the first patterned conductive layer 19 and the first supplemental conductive layer 40 as shown. A thickness range of the conductive layer 40 may be between about 10 microns and about 50 microns. In the embodiment of FIG. 10c, the first/second supplemental insulating layer 26/28 may be laminated onto the first/second patterned conductive layer 19/20 along with a first/second supplemental conductive layer 40/44 disposed on one side of the first/second supplemental insulating layer 26/28. The first/second supplemental insulating layers 26/28 are shown in the embodiment of FIG. 10c as being provided onto the first patterned conductive layer 19/20 such that the supplemental insulating layer 26/28 is disposed between the first/second patterned conductive layer 19/20 and the first/second supplemental conductive layer 40/44 as shown. The first/second supplemental conductive layers 40/44 may include thin conductive layers such as thin copper (having a thickness of less than about 10 microns, and preferably less than about 5 microns. In the embodiment of FIG. 11c, on the other hand, the first and second supplemental insulating layers 26 and 28 are shown as having been provided onto the starting layer 14 without any conductive layers being provided thereon.

Figure 9D:
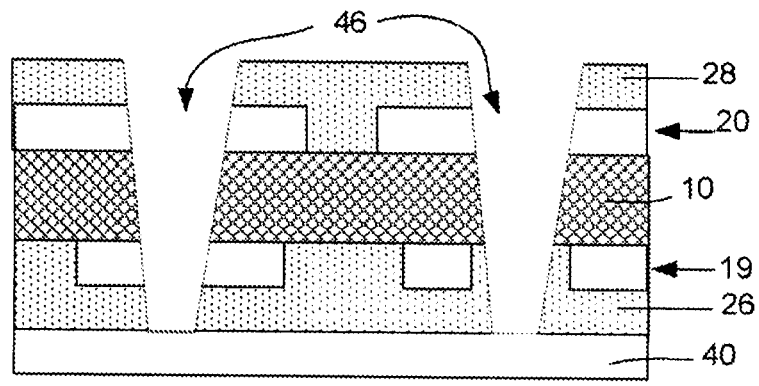
Figure 9F:
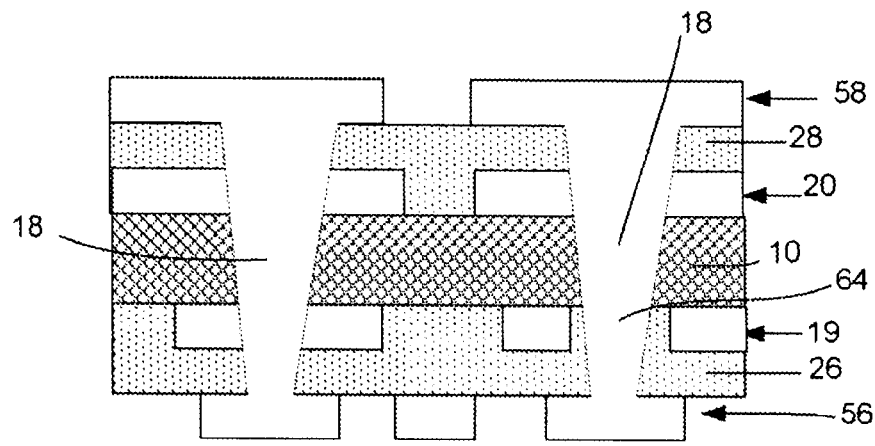
Figure 10D:
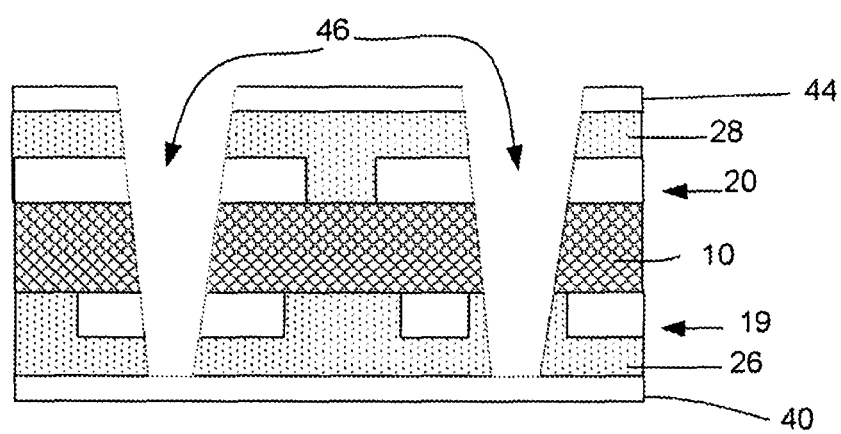
Figure 10F:
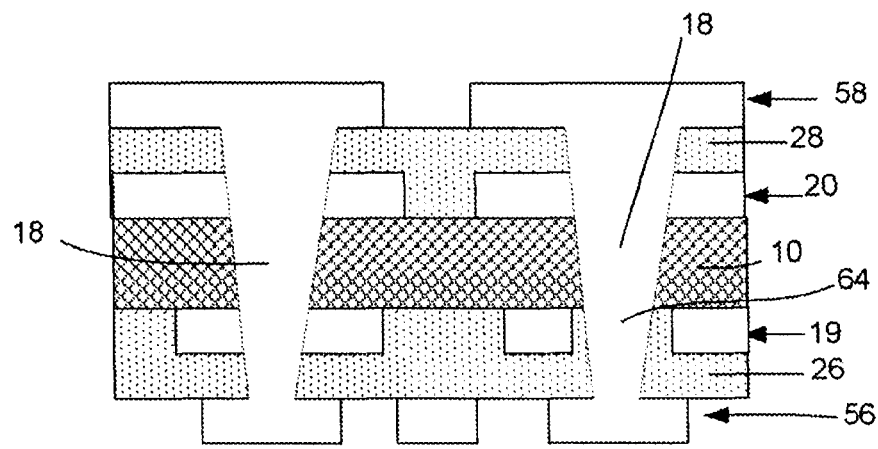
Figure 11D:
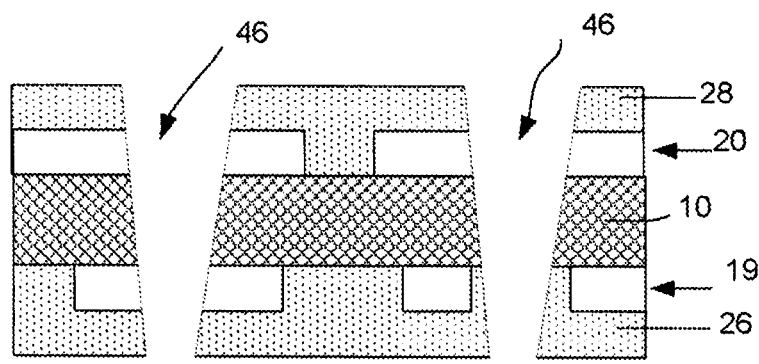

Referring next to FIGS. 9d, 10d and 11d, embodiments include laser drilling a set of through via openings 46 extending from a side of the second supplemental insulating layer 28 farthest from the second patterned conductive layer 20, up to a side of the first supplemental insulating layer 26 farthest from the first patterned conductive layer 19, such that the via openings 46 extend through at least some of the conductive layer openings 38 of the first patterned conductive layer 19 and of the second patterned conductive layer 20. It is clear from FIGS. 9d, 10d and 11d that, by pre-patterning the first and second conductive layers 12 and 13 (FIGS. 9a, 10a and 11a) prior to laser drilling, the necessity to drill through layers of conductive material while providing the through via openings 46 is advantageously obviated. Although laser drilling of some of the material of the patterned conductive layers 19 and 20 may take place during laser drilling of the via openings, especially at the edges of some of the openings 38, in order to accommodate a possibly larger size of the via openings 46 than a size of the conductive layer openings 38 accommodating the via openings 46, such drilling would be minimal compared to a laser drilling that would have to take place if the conductive layers 12 and 13 (FIGS. 9a, 10a and 11a) were not pre-patterned. For laser drilling, a carbon dioxide gas laser beam, an ultraviolet laser beam or an excimer laser beam may be used. Referring now still to FIG. 9d, the shown method embodiment involves laser drilling the via openings such that the openings extend to the first supplemental conductive layer 40. Referring next to FIG. 10d, the shown method embodiment involves laser drilling the via openings such that the openings extend through the second supplemental conductive layer 44 to the first supplemental conductive layer 40. Referring finally to FIG. 11d, the shown method embodiment involves laser drilling the via openings such that the openings extend through the second supplemental insulating layer 26, the conductive layer openings 38, the starting insulating layer 10, and the first supplemental insulating layer 28 as shown. According to embodiments, the laser drilling of via openings results in laser drilled via openings which may exhibit, as shown in FIGS. 9f, 10f and 11g, a conical configuration.

Figure 9E:
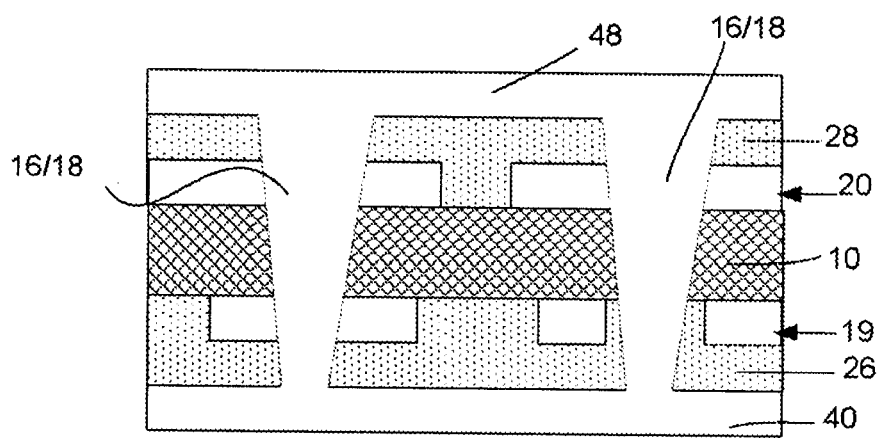
Figure 10E:
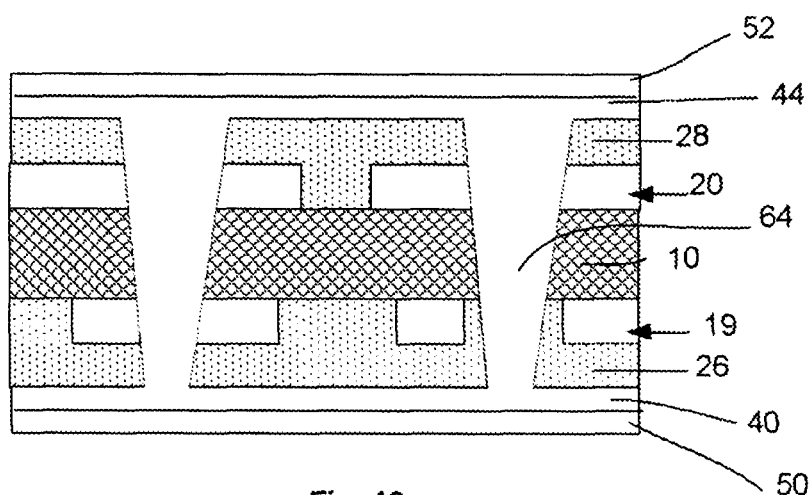
Figure 11E:
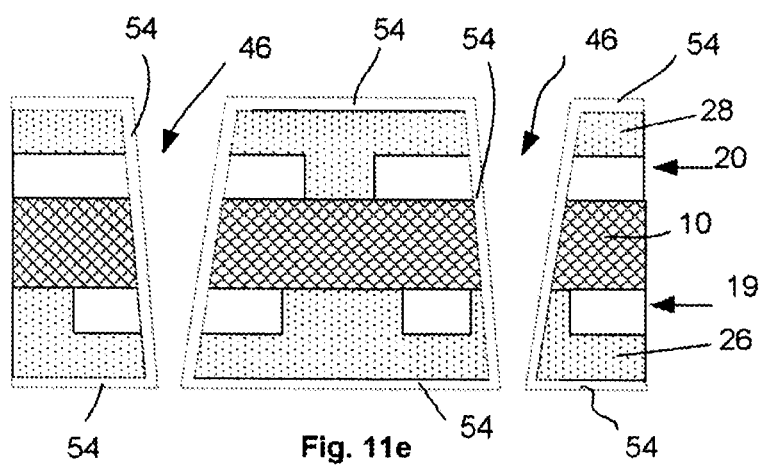
Figure 11F:
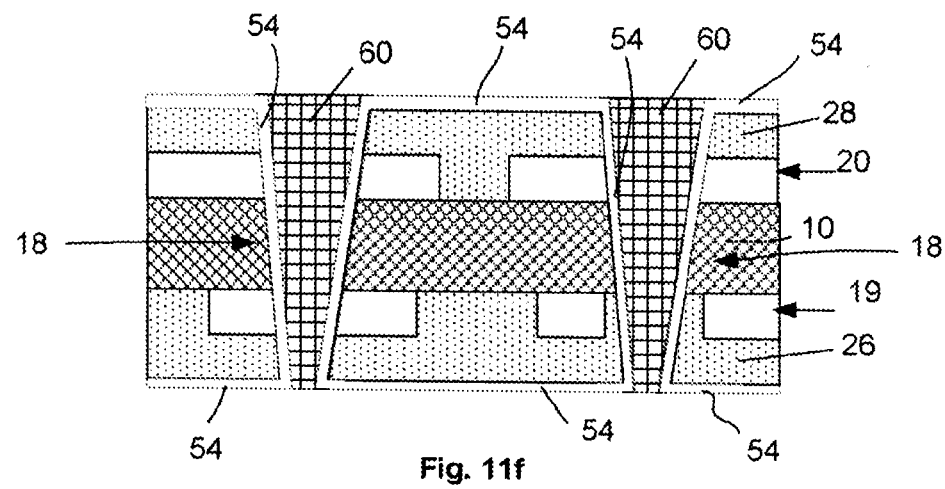

Referring next to FIGS. 9e, 10e and 11e, embodiments include filling the set of via openings 46 with a conductive material 16 to provide a set of conductive vias 18 as shown. Preferably, the conductive material 16 includes copper, but it may also include other conductive materials as would be within the knowledge of one skilled in the art. In the embodiments of FIGS. 9e and 10e, filling the conductive vias may include plating, such as copper plating. For the embodiment of FIG. 9e, after filling of the via openings 46, for example by way of plating, filling the via openings 46 may involve providing a second supplemental conductive layer 48 on one side of the second supplemental insulating layer 28. For the embodiment of FIG. 10e, after filling the via openings 46, for example by way of plating, filling the via openings 46 may involve plating first and second extra conductive layers 50 and 52 onto respective ones of the first and second supplemental conductive layer 40 and 44. The additional plated conductive layers 48 in FIGS. 9e and 50 and 52 in FIG. 10e may later be patterned as will be described in further detail in relation to FIGS. 9f and 10f, respectively. Referring next to the embodiment of FIG. 11e, filling the via openings 46 may involve first plating the via openings 46 and the exposed surfaces of the first and second supplemental insulating layers 26 and 28 to achieve plating layers 54 on the walls of the via openings 46 and on the exposed surfaces of the first and second supplemental insulating layers 26 and 28 as shown. Referring still to the embodiment of FIG. 11e, filing the set of via openings 46 may further include plugging the via openings with a plugging material 60 in a well known manner after providing the plating layers 54 to provide plated plugged conductive vias 18 as shown.

Figure 11G:
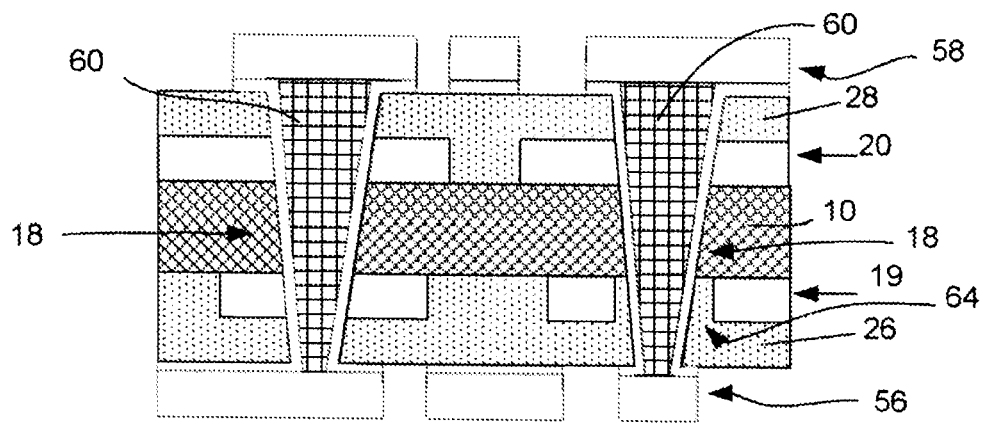

Referring next to FIGS. 9f, 10f and 11f-g, embodiments include providing a first supplemental patterned conductive layer 56 onto the first supplemental insulating layer 26, and a second supplemental patterned conductive layer 58 onto the second supplemental insulating layer 28 such that the set of conductive vias 18 contacts the first supplemental patterned conductive layer 56 at one side thereof, and the second supplemental patterned conductive layer 58 at another side thereof. According to the embodiment of FIG. 9f, the shown method may involve patterning the first supplemental conductive layer 40 and the second supplemental conductive layer 44 of FIG. 9e, such as, for example, by way of subtractive patterning involving, for example, etching, to yield the first supplemental patterned conductive layer 56 and the second supplemental patterned conductive layer 58. According to the embodiment of FIG. 10f, the shown method may involve patterning a combination of the first supplemental conductive layer 40 and the first extra conductive layer 50 by way of subtractive patterning involving, for example, etching, to yield the first supplemental patterned conductive layer 56. The embodiment of FIG. 10f may further involve patterning a combination of the second supplemental conductive layer 44 and the second extra conductive layer 52 by way of subtractive patterning involving, for example, etching, to yield the second supplemental patterned conductive layer 58. For the embodiment of FIGS. 11f-g, on the other hand, providing the first and second supplemental patterned conductive layers 56 and 58 may include using semi-additive patterning onto the plating layers 54 present on respective ones of the first and second supplemental insulating layers. A semi-additive process is a well known process according to which, for example, a photoresist may be deposited on the plating layer 54, which photoresist may then be exposed to light and developed, whereby a resist pattern may be formed while leaving, on the plating layers 54, a non-mask region corresponding to the pattern of the first and/or second supplemental patterned conductive layer. By means of electroplating, the plating layer may be used as a seed layer to stack an electroplated film in the non-mask regions. The resist pattern may then be removed by etching, and thereafter the electroless plating film which was till then covered with the resist pattern, may be removed by etching. In this way, the first and second supplemental patterned conductive layers 56 and 58 may be formed according to the third embodiment as shown in FIG. 11g.

Embodiments as shown by way of example with respect to FIG. 9a-9f, 10a-10f or 11a-11g, may respectively yield a multilayer substrate core structure 100 as shown in FIG. 9f, a multilayer substrate core structure 200 as shown in FIG. 10f, and a multilayer substrate core structure 300 as shown in FIG. 11g. Boards 100/200/300 each include the starting insulating layer 10, first patterned conductive layer 19 on one side of the starting insulating layer 10, and second patterned conductive layer on another side of the starting insulating layer 10. The boards 100/200/300 additionally include: first and second supplemental insulating layers 26 and 28 disposed, respectively, on the first and second patterned conductive layer 19 and 20; first and second supplemental patterned conductive layers 56 and 58 disposed, respectively, on the first and second supplemental insulating layers 26 and 28; and a set of conductive through vias 18 provided in corresponding laser-drilled via openings extending from the second supplemental patterned conductive layer 58 to the first supplemental patterned conductive layer 56, the via openings extending through the first patterned conductive layer 19 and the second patterned conductive layer 20 as shown. According to some embodiments, the set of conductive vias 18 may include a plated conductive material therein. According to one embodiment as shown in FIG. 11g, the set of conductive vias 18 may include a plugging material 60 therein. According to some embodiments, the set of conductive vias may include a skip via, such as skip via 64 of FIGS. 9f/10f/11g, and/or a padless via (not shown).

Although the substrate core structure structures shown in FIGS. 9f, 10f and 11g, respectively, show only two supplemental insulating layers, two conductive vias and four sets of patterned conductive layers, embodiments are not so limited, and include within their ambit the provision of as many supplemental insulating layers, conductive vias, and patterned conductive layers as necessary in order to arrive at a desired substrate core structure structure. The provision of the various additional elements noted above, including the supplemental insulating layers, conductive vias, and sets of patterned conductive layers may be effected as noted above either with respect to the first embodiment as shown in FIGS. 9a-9f, with respect to the second embodiment as shown in FIGS. 10a-10f, or with respect to the third embodiment as shown in FIGS. 11a-11g.

Advantageously, embodiments provide a method to enable building multilayer substrate core structures by way of laser drilled through via openings using pre-patterned conductive build-up layers on the starting insulating layer of the board. Embodiments address a new multilayer substrate core structures and a method of building the same in which the costly plated through hole structure is replaced with the low cost laser drilled microvias. Embodiments effectively address among other things the problems of: (1) high cost prior art substrate core structures which use mechanical drilling technology by replacing the costly mechanically drilled plated through holes with low cost laser drilled microvias; (2) the need to laser drill through conductive layers such as copper by achieving low cost, shorter processing times, and high reliability of a laser drilled via core structure that obviates the need to laser drill through a thickness of the conductive layers. An embodiment provides a lower cost method of fabrication than prior art methods by not only replacing the prior art plated through hole regime with laser drilled through microvias, but also by reducing the core dielectric material thickness (by virtue of the generally reduced via dimensions and line and space features possible according to embodiments). In addition, laser drilling according to embodiments allows for higher starting insulating layer connection density as compared with prior art structures, owing to small via sizes and pitches, thus allowing for smaller sized vias and smaller pitches, in this way leading to an improved design and to scalable miniaturization at low cost. Laser drilling according to embodiments features high alignment accuracy and through-put (up to about 1000 vias/sec), a wide range of possible via sizes, and low cost (about 2 cents per about 60 to about 100 vias). The combination of high alignment accuracy and small via size make possible, for example for a four layer core structure, via diameters of about 50 microns at the bottom and of about 140 microns at the top, pad sizes of about 170 microns at the top and about 100 microns at the bottom, which sizes are much less than typical plated through hole sizes including diameters of about 250 microns and pad sizes of about 400 microns. Pitches according to embodiments may further be much less than typical through hole pitches of about 475 microns. Moreover, embodiments lead to substrate core structure substrate structures having potentially smaller form factors (by virtue of potentially smaller pitches, pad sizes, via dimensions), and a potentially smaller z-height (by virtue of potentially finer routing through the thickness of the insulating layers, which may lead to thinner insulating layers and/or the use of a smaller amount of insulating layers). Additionally, embodiments advantageously allow the provision of a padless via structure in the core layers. Embodiments further allow conductive material, such as copper, pre-patterning in the inner core layers to accommodate for lamination and cladding accuracy and enable skip via connection. This is because, according to embodiments, the via openings in different metal layers are formed simultaneously.

Referring to FIG. 12, there is illustrated one of many possible systems 900 in which embodiments of the present invention may be used. In one embodiment, the electronic assembly 1000 may include a substrate core structure structure, such as structure 100 of FIG. 9f or structure 200 of FIG. 10f or structure 300 of FIG. 11g. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 12, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A multilayer substrate core structure including:
a starting insulating layer having a first side with a first planar surface and an opposite second side with a second planar surface;
a first patterned conductive layer on the first planar surface of the first side of the starting insulating layer, and a second patterned conductive layer on the second planar surface of the second side of the starting insulating layer;
a first supplemental insulating layer on the first patterned conductive layer and on the first planar surface of the first side of the starting insulating layer;
a second supplemental insulating layer on the second patterned conductive layer and on the second planar surface of the second side of the starting insulating layer;
a first supplemental patterned conductive layer on the first supplemental insulating layer;
a second supplemental patterned conductive layer on the second supplemental insulating layer; and
a set of conductive vias provided in corresponding via openings extending from the second supplemental patterned conductive layer to the first supplemental patterned conductive layer, the via openings further extending through the first patterned conductive layer and the second patterned conductive layer, the via openings having a conical configuration providing a wider opening in the first patterned conductive layer than in the second patterned conductive layer, wherein at least one conductive via of the set of conductive vias is in electrical contact with the first and second supplemental patterned conductive layers and with the first and second patterned conductive layers, and wherein the at least one conductive via completely fills the corresponding via opening and has the conical configuration.

2. The substrate core structure of claim 1, wherein the set of conductive vias include a plated conductive material therein.

3. The substrate core structure of claim 1, wherein the set of conductive vias includes a skip via.

4. The substrate core structure of claim 1, wherein the starting insulating layer and the supplemental insulating layer each comprise at least one of a glass epoxy resin and bismaleimide-triazine (BT).

* * * * *